(12) United States Patent
Sano

(10) Patent No.: US 10,439,113 B2
(45) Date of Patent: Oct. 8, 2019

(54) LIGHT EMITTING DEVICE

(71) Applicant: NICHIA CORPORATION, Anan-shi (JP)

(72) Inventor: Takayuki Sano, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/719,563

(22) Filed: Sep. 29, 2017

(65) Prior Publication Data

US 2018/0097161 A1 Apr. 5, 2018

(30) Foreign Application Priority Data

Sep. 30, 2016 (JP) .................................. 2016-194077

(51) Int. Cl.
| | |
|---|---|
| *H01L 33/60* | (2010.01) |
| *H01L 33/50* | (2010.01) |
| *H01L 33/58* | (2010.01) |
| *H01L 33/54* | (2010.01) |

(52) U.S. Cl.
CPC ............ *H01L 33/60* (2013.01); *H01L 33/507* (2013.01); *H01L 33/58* (2013.01); *H01L 33/50* (2013.01); *H01L 33/54* (2013.01); *H01L 2933/0091* (2013.01)

(58) Field of Classification Search
CPC ....................................................... H01L 33/60
See application file for complete search history.

(56) References Cited

U.S. PATENT DOCUMENTS

| | | | | | |
|---|---|---|---|---|---|
| 6,809,342 | B2 * | 10/2004 | Harada | ................. | H01L 33/44 257/79 |
| 7,005,679 | B2 * | 2/2006 | Tarsa | ................. | H01L 25/0753 257/100 |
| 7,371,593 | B2 * | 5/2008 | Harada | ................. | H01L 33/504 438/106 |
| 7,442,563 | B2 * | 10/2008 | Harada | ................. | H01L 33/508 438/26 |
| 7,700,965 | B2 * | 4/2010 | Chang | ................. | H01L 33/508 257/100 |

(Continued)

FOREIGN PATENT DOCUMENTS

| | | |
|---|---|---|
| JP | 2005-191420 | 7/2005 |
| JP | 2006-114637 | 4/2006 |

(Continued)

*Primary Examiner* — Eugene Lee
(74) *Attorney, Agent, or Firm* — Mori & Ward, LLP

(57) ABSTRACT

A light emitting device includes a light emitting element, a sealing member, and a first film. The light emitting element has a light emitting surface from which a light is emitted. The sealing member is provided on the light emitting surface of the light emitting element to cover the light emitting surface and having a light output surface via which the light is output from the sealing member. The light output surface being curved to have a concave shape. The sealing member includes a light-transmissive material containing a fluorescent material to convert a wavelength of the light emitted from the light emitting element. The first film is disposed on a part of the light output surface of the sealing member to partially reflect the light emitted from the light emitting element.

22 Claims, 7 Drawing Sheets

(56) References Cited

U.S. PATENT DOCUMENTS

| | | | |
|---|---|---|---|
| 7,737,621 B2* | 6/2010 | Masuda | C09K 11/0883 |
| | | | 252/301.4 R |
| 7,777,243 B2* | 8/2010 | Lin | H01L 33/508 |
| | | | 257/98 |
| 7,859,001 B2* | 12/2010 | Niino | H01L 33/54 |
| | | | 257/100 |
| 7,889,421 B2* | 2/2011 | Narendran | H01L 33/507 |
| | | | 359/326 |
| 7,974,018 B2* | 7/2011 | Braune | B29C 45/1615 |
| | | | 359/642 |
| 8,492,746 B2* | 7/2013 | Yen | H01L 33/50 |
| | | | 257/14 |
| 8,591,072 B2* | 11/2013 | Shani | G02B 6/0021 |
| | | | 362/296.01 |
| 8,884,315 B2* | 11/2014 | Harada | H01L 33/486 |
| | | | 257/89 |
| 8,946,987 B2* | 2/2015 | Hsieh | H01L 33/505 |
| | | | 257/80 |
| 9,006,761 B2* | 4/2015 | Oyamada | H01L 33/504 |
| | | | 257/301 |
| 9,347,646 B2* | 5/2016 | Kim | F21V 9/00 |
| 2001/0030326 A1* | 10/2001 | Reeh | C09K 11/7718 |
| | | | 257/98 |
| 2002/0057056 A1* | 5/2002 | Okazaki | H01L 33/505 |
| | | | 313/512 |
| 2003/0067264 A1* | 4/2003 | Takekuma | H01L 33/507 |
| | | | 257/E33.073 |
| 2003/0201451 A1 | 10/2003 | Suehiro et al. | |
| 2003/0214233 A1* | 11/2003 | Takahashi | H01L 33/508 |
| | | | 313/512 |
| 2005/0139851 A1 | 6/2005 | Sato | |
| 2005/0221518 A1* | 10/2005 | Andrews | H01L 33/52 |
| | | | 438/27 |
| 2006/0034084 A1* | 2/2006 | Matsuura | H01L 33/507 |
| | | | 362/293 |
| 2006/0071591 A1* | 4/2006 | Takezawa | B29C 45/0013 |
| | | | 313/501 |
| 2006/0076569 A1 | 4/2006 | Otsuka et al. | |
| 2006/0099449 A1* | 5/2006 | Amano | C09K 11/06 |
| | | | 428/690 |
| 2007/0057618 A1 | 3/2007 | Otsuka et al. | |
| 2008/0191620 A1* | 8/2008 | Moriyama | H01L 33/56 |
| | | | 313/506 |
| 2009/0134415 A1 | 5/2009 | Morioka | |
| 2009/0140630 A1* | 6/2009 | Kijima | C09K 11/661 |
| | | | 313/498 |
| 2009/0146171 A1 | 6/2009 | Okubo | |
| 2009/0267099 A1 | 10/2009 | Sakai | |
| 2011/0260035 A1* | 10/2011 | Seger | H04N 5/2254 |
| | | | 250/208.1 |
| 2012/0098007 A1* | 4/2012 | Kuo | G02F 1/157 |
| | | | 257/98 |
| 2012/0305973 A1 | 12/2012 | Chosa et al. | |
| 2013/0300285 A1 | 11/2013 | Ito | |
| 2014/0367633 A1* | 12/2014 | Bibl | G02F 1/133603 |
| | | | 257/13 |
| 2015/0028373 A1 | 1/2015 | Abe et al. | |
| 2015/0171282 A1* | 6/2015 | Wakaki | H01L 33/486 |
| | | | 257/99 |
| 2015/0192255 A1* | 7/2015 | Kim | H01L 33/58 |
| | | | 362/293 |
| 2016/0265741 A1 | 9/2016 | Yamada et al. | |
| 2017/0030532 A1* | 2/2017 | Ryohwa | H01L 33/501 |
| 2018/0033920 A1* | 2/2018 | Steltenpol | H05B 33/22 |

FOREIGN PATENT DOCUMENTS

| | | |
|---|---|---|
| JP | 2006-165326 | 6/2006 |
| JP | 2006-190813 | 7/2006 |
| JP | 2007-053352 | 3/2007 |
| JP | 2007-157943 | 6/2007 |
| JP | 2007-180339 | 7/2007 |
| JP | 2007-221044 | 8/2007 |
| JP | 2009-130301 | 6/2009 |
| JP | 2009-141051 | 6/2009 |
| JP | 2009-212287 | 9/2009 |
| JP | 2009-283887 | 12/2009 |
| JP | 2010-056337 | 3/2010 |
| JP | 2010-219324 | 9/2010 |
| JP | 2015-026698 | 2/2015 |
| JP | 2015-026871 | 2/2015 |
| JP | 2016-171227 | 9/2016 |
| WO | WO 2011/096171 | 8/2011 |
| WO | WO 2012/099145 | 7/2012 |

* cited by examiner

LIGHT EMITTING DEVICE

CROSS-REFERENCE TO RELATED PATENT APPLICATION

The present application claims priority under 35 U. S. C. § 119 to Japanese Patent Application No. 2016-194077, filed Sep. 30, 2016. The contents of this application are incorporated herein by reference in their entirety.

BACKGROUND OF THE INVENTION

Field of the Invention

The present disclosure relates to a light emitting device.

Discussion of the Background

Japanese Unexamined Patent Application Publication No. 2009-141051 describes a light emitting diode device having a light emitting diode element, a silicon resin having a tacky surface encapsulating the light emitting diode element, and microparticles disposed on substantially the entire surface of the silicone resin. For the microparticles, pigment particles, colored particles using a dye, phosphor particles, are described as well as materials such as $SiO_2$, $Al_2O_3$, AlN, $TiO_2$ and the like. Such microparticles are attached to substantially entire surface of the silicone resin to reduce a decrease in the luminous intensity.

Japanese Unexamined Patent Application Publication No. 2007-221044 describes a light emitting device having a side-surface reflecting member surrounding a light emitting element to reflect excitation light emitted from a light emitting element so that the reflected light is efficiently directed in a forward direction, a first wavelength converting layer formed on the side-surface reflecting member, a second wavelength converting layer formed on a substrate and covering the light emitting element, an opposed reflecting member covering a portion of the second wavelength converting layer, and an inner peripheral reflecting member disposed inward than the side-surface reflecting member to surround the light emitting element. This light emitting device is configured to create an optical path in which light emitted from the light emitting device is reflected upward by the inner peripheral reflecting member and further reflected downward by the opposed reflecting member, then reflected by the side-surface reflecting member and emitted to the outside.

SUMMARY OF THE INVENTION

According to one aspect of the present invention, a light emitting device includes a light emitting element, a sealing member, and a first film. The light emitting element has a light emitting surface from which a light is emitted. The sealing member is provided on the light emitting surface of the light emitting element to cover the light emitting surface and having a light output surface via which the light is output from the sealing member. The light output surface being curved to have a concave shape. The sealing member includes a light-transmissive material containing a fluorescent material to convert a wavelength of the light emitted from the light emitting element. The first film is disposed on a part of the light output surface of the sealing member to partially reflect the light emitted from the light emitting element.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
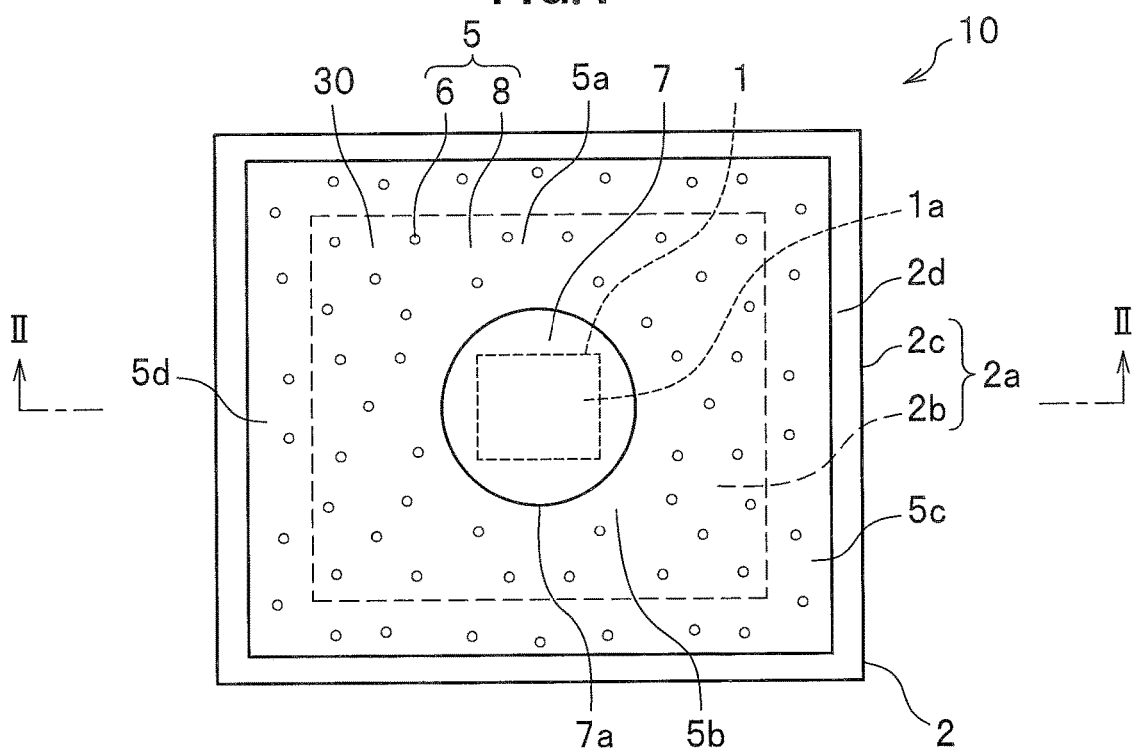
FIG. 1 is a schematic plan view showing a light emitting device according to a first embodiment.

The embodiments will now be described with reference to the accompanying drawings, wherein like reference numerals designate corresponding or identical elements throughout the various drawings.

First Embodiment

A light emitting device according to a first embodiment will be illustrated below with reference to accompanying drawings.

However, the following embodiment is to exemplify a light emitting device for embodying the technical idea of the present invention, and the technical idea of the present invention is not limited to the following. Particularly, the sizes, materials, shapes and the relative positions of the members described in examples are given as an example and not as a limitation to the scope of the invention unless specifically stated. Note that the sizes and the arrangement relationships of the members in each of drawings are occasionally shown exaggerated and shapes may be simplified for ease of explanation. In the description below, the same designations or the same reference numerals denote the same or like members and duplicative descriptions will be appropriately omitted.

In the light emitting device according to the embodiments, a relative location expressed as "upper" and "lower", "left" and "right" or so forth may be vice versa, depends on the situation. In the present specification, the terms such as "upper" and "lower" are used to illustrate a relative locational relationship between the components in a drawing which is referred to, and unless specifically indicated, are not intended to show absolute positional relationship.

Configuration of Light Emitting Device

Figure 2:
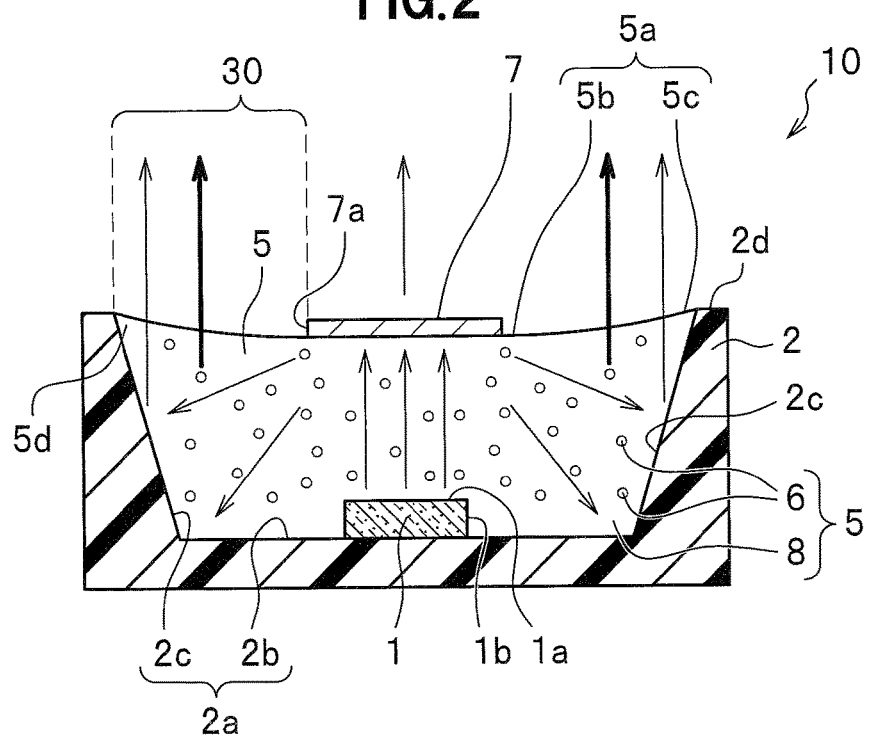
FIG. 2 is a schematic cross-sectional view showing a light emitting device according to the first embodiment.
Figure 3:
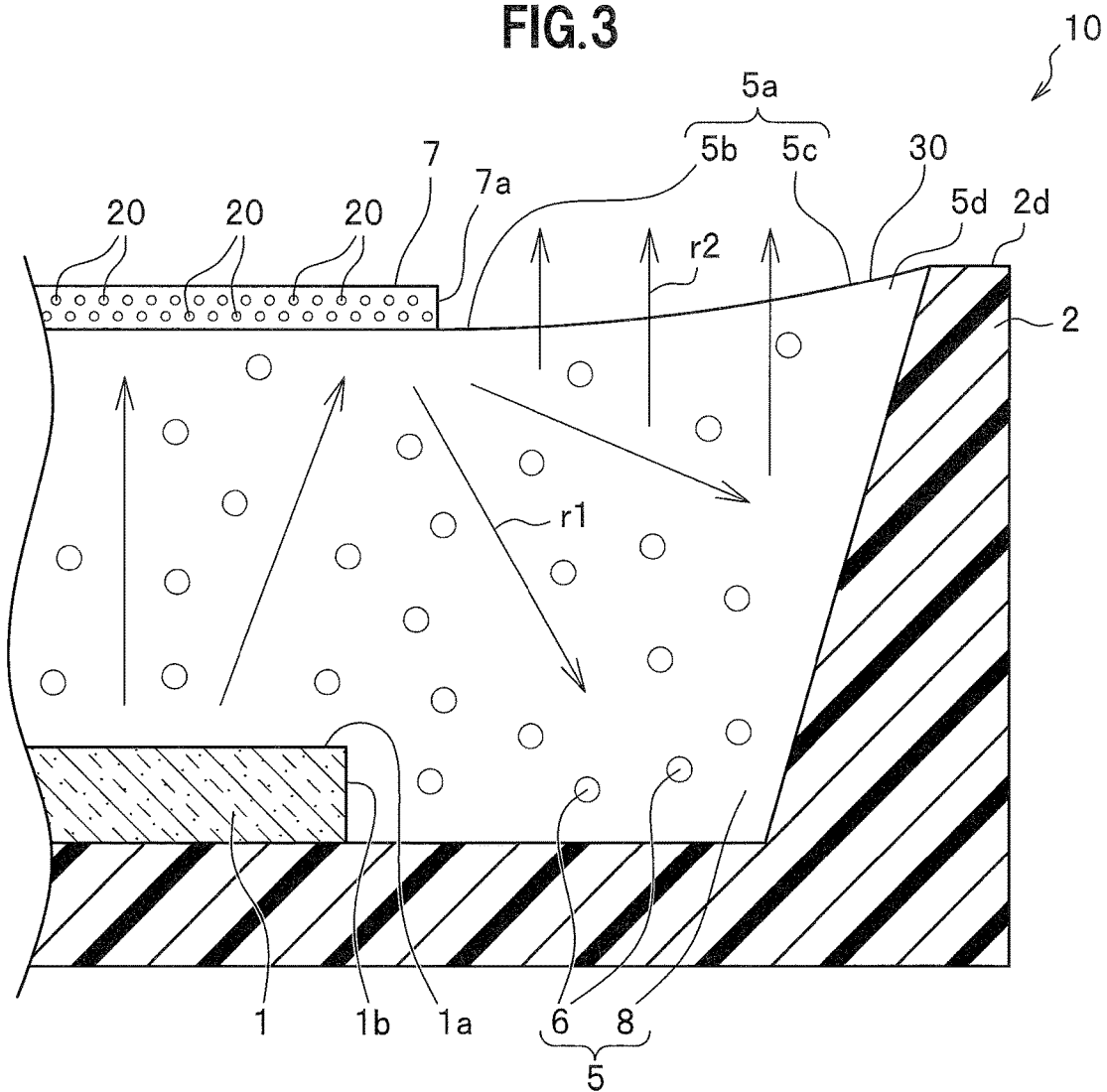
FIG. 3 is an enlarged schematic cross-sectional view of a part of the light emitting device according to the first embodiment.
Figure 4:
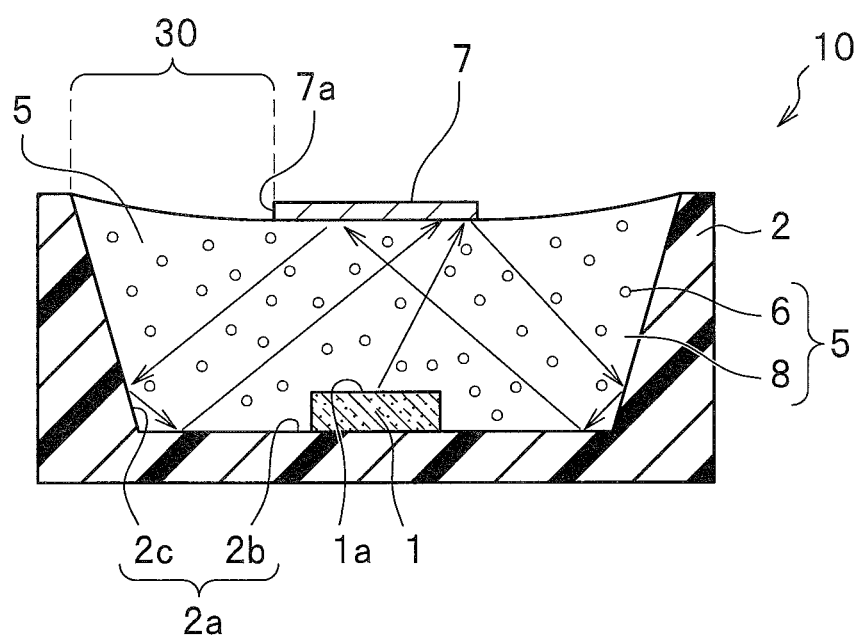
FIG. 4 is a schematic cross-sectional view showing a light emitting device according to the first embodiment.

A light emitting device 10 according to the first embodiment will be described with reference to FIG. 1 to FIG. 4. FIG. 1 is a schematic plan view showing a light emitting device 10 according to a first embodiment. FIG. 2 is a schematic cross-sectional view showing the light emitting device 10 according to the first embodiment, taken along line II-II of FIG. 1. FIG. 3 is an enlarged schematic cross-sectional view of a part of the light emitting device 10 according to the first embodiment. FIG. 4 is a schematic cross-sectional view showing a light emitting device according to the first embodiment.

The light emitting device 10 includes a light emitting element 1, a package 2 housing the light emitting element 1, a sealing member 5 covering the light emitting element 1, and a first film 7 disposed on an upper surface of the sealing member 5. The upper surface of the sealing member 5 curves in a recessed shape. An outer peripheral edge of the first film 7 and an outer peripheral edge of the sealing member 5 are at least partially spaced apart from each other. In the present embodiment, the outer peripheral edge of the first film 7 and the outer peripheral edge of the sealing member 5 are entirely spaced apart from each other.

The light emitting element 1 has an n-side electrode and a p-side electrode that are respectively a positive pad electrode and a negative pad electrode, and the n-side electrode and the p-side electrode are electrically connected to corresponding lead electrodes via wires, respectively.

The sealing member 5 contains a fluorescent material 6 to convert the wavelength of the light from the light emitting element 1 and a light-transmissive material 8 that contains the fluorescent material 6. The first film 7 is configured to allow passing of most of the light from the light emitting element 1, and reflect a portion of light from the light emitting element 1. The first film 7 is also configured to allow passing of most of the light from the fluorescent material 6. The expression "most of light" from the light emitting element 1 passing the first film 7 refers to at least 90% of light from the light emitting element 1, which is preferably 95% or more, and particularly preferably 97% or more. Light reflected by the first film 7 is irradiated on the phosphor 6 which emits light having a wavelength different from that of light emitted from the light emitting element 1. This arrangement allows for fine adjustment of color of the light while maintaining the amount of light emitted from the light emitting device 10.

When the bottom surface 2b of the recess 2a of the package 2 is flat, a portion of light emitted from the light emitting element 1 and/or a portion of light reflected by the first film 7 may be reflected at the bottom surface 2b of the recess 2a of the package 2 and released to the outside. Forming the bottom surface 2b of the recess 2a of the package 2 in a mirror surface can improve the reflecting efficiency.

Meanwhile, when the bottom surface 2b of the recess 2a of the package 2 and the upper surface of the sealing member 5 are substantially in parallel to each other, a portion of light emitted from the light emitting element 1 and/or a portion of light reflected by the first film 7 may be repeatedly reflected between the bottom surface 2b of the recess 2a of the package 2 and the upper surface of the sealing member 5. This repetitive reflection can be reduced by roughening or forming fine unevenness on the bottom surface 2b of the recess 2a.

The structure of the light emitting device body 10 will be described below.

Package

The package 2 has a substantially rectangular parallelepiped shape which has a substantially rectangular outer shape when viewed in the upward direction. The package 2 defines a recess 2a with a bottom surface 2b and one or more inner lateral surfaces 2c so as to open upward, to house the light emitting element 1 and the sealing member 5. Lead electrodes are provided approximately at the center of the bottom surface 2b of the recess 2a of the package 2, for disposing the light emitting element 1.

One or more inner lateral surfaces 2c that are continuously inclined from the bottom surface 2b to the upper edge 2d of the opening, with the opening widening upward. The package 2 may be a plate-shaped substrate without the recess 2a. For example, the light emitting device having the sealing member and the first film on a plate-shaped substrate can be provided by placing a frame on a plate-shaped substrate and disposing the substrate member and the first film in the frame, then removing the frame.

When viewed in the upward direction, the outer shape of the package 2 and/or the shape of the recess can be a polygonal shape such as a rectangular shape, a triangular shape, a hexagonal shape, or the like, or a circular shape, an elliptic shape, an oval shape, or the like, as well as a square shape.

Examples of the resin materials used for the package 2 include thermoplastic resins and thermosetting resins. More specific examples of the thermoplastic resins include polyphthalamide (PPA), liquid crystal polymer (LCP), polybutylene terephthalate (PBT), and unsaturated polyester resin (UPR). More specific examples of the thermosetting resin include epoxy resin, modified epoxy resin, silicone resin, and modified silicone resin. For example, the package 2 can be formed by way of injection molding, using a thermoplastic resin such as a polyphthalamide resin that contains a reflecting material such as titanium oxide. The package 2 can also be formed by way of transfer molding, using a thermosetting resin such as an epoxy resin or a silicone resin, containing a reflecting material such as titanium oxide.

The bottom surface 2b and the one or more inner lateral surfaces 2c of the package 2 preferably contain a reflecting member so that light can be reflected upward. Examples of the light-reflecting material include oxides of Ti, Zr, Nb, Al, Si, and AlN, $MgF_2$, and BN, of those, titanium oxide ($TiO_2$) is preferable. In addition to the reflecting member, a reinforcing material to increase mechanical strength, a filler material, a light diffusing material, etc., may be optionally contained in the package 2.

For the package 2, ceramics such as alumina, aluminum nitride, or the like can be used alternatively to such a resin.

Light Emitting Element

For the light emitting element 1, a semiconductor light emitting element such as a semiconductor light emitting diode (LED) or a semiconductor laser diode (LD) can be used. The light emitting element 1 having a quadrangular shape when viewed in the upward direction will be illustrated below. As a quadrangular shape, a square shape or a rectangular shape is preferable because a low-cost general material in the market can be employed. When viewed in the upward direction, the shape of the light emitting element 1 can be a pentagonal shape, a hexagonal shape, a heptagonal shape, or an octagonal shape, as well as a quadrangular shape. Of those, a regular pentagonal shape, a regular hexagonal shape, a regular heptagonal shape, or a regular octagonal shape is preferable in order to minimize a difference between the shortest distance and the longest distance from the center to a periphery of the light emitting element 1. That is, when a square light emitting element 1 and a regular octagonal light emitting element 1 of nearly identical area are compared, the difference between the shortest distance and the longest distance from the center to a periphery of the light emitting element 1 is smaller in the regular octagonal shape than in the square shape. Thus, when the first film 7 has a circular shape when viewed in the upward direction, a smaller first film 7 can be employed. With this arrangement, the first film 7 can be adjusted to the shape of the light emitting element 1 and the light extraction efficiency can be improved.

Further, the outer lateral surfaces 1b of the light emitting element 1 may be substantially perpendicular to the upper surface 1a or inclined inward or outward.

The light emitting element 1 can have a thickness, for example, in a range of 0.02 mm to 1 mm, and in view of the strength of the light emitting element 1, preferably in a range of 0.05 mm to 0.5 mm.

For example, the first embodiment employs the light emitting element 1 of a gallium nitride-based semiconductor, having a substantially square shape with a side of 650 µm in a plan view, a thickness of 200 µm, and a peak emission wavelength of 420 nm. The light emitting element 1 has an element structure constituted with a various semiconductors and positive and negative electrodes. More specifically, a light emitting element 1 of a nitride-based semiconductor ($In_xAl_yGa_{1-x-y}N$, $0 \leq x$, $0 \leq y$, $x+y \leq 1$) that can efficiently excite a fluorescent material 6 is particularly preferably used.

The first film 7 is applied to cover at least directly above the light emitting element 1, and either a single or a plurality of light emitting elements 1 may be mounted on a single light emitting device 10. A plurality of first films 7 may be provided corresponding to a plurality of light emitting elements 1 respectively, but the number of the first films 7 may be smaller than the number of the light emitting elements 1. For example, a single first film 7 may be provided to cover directly above two light emitting elements 1. In this case, the area of the first film 7 is greater than the sum of upper surface areas of the two light emitting elements 1, but with a single first film 7, orientation can be more easily controlled than with two or more first films.

The size of the light emitting element 1 can be appropriately designed, and a substantially square shape with a side of 300 µm, 500 µm, or 1 µm, or a substantially rectangular shape with dimensions of 300 µm×500 µm, or 500 µm×650 µm can be used.

Further, the light emitting element 1 having an emission wavelength that can excite the fluorescent material 6 is preferable. The light emitting element 1 preferably has a peak emission wavelength in a range of 400 nm to 500 nm. The light emitting element 1 adapted to emit light in a wavelength range that does not excite the fluorescent material 6 or that barely excite the fluorescent material 6 may also be used. Because, a portion of light from the light emitting element 1 is reflected at the first film 7, so that amount of light from the light emitting element 1 that is directly emitted to the outside can be reduced and irradiated on the fluorescent material 6 etc., thus, the amount of light from the fluorescent material 6 can be increased, that allows adjustment of the color of light.

If the light emitting element 1 is covered only by the sealing member 5, several percent of light from the light emitting element 1 will be reflected at the interface between the sealing member 5 and ambient air. By the reflection at the interface, light from the light emitting element 1 can be irradiated again on the fluorescent material 6. In contrast, the several percent of the reflection can be further reduced by disposing the first film 7 on the upper surface of the sealing member 5, which facilitates transmittance of light from the light emitting element 1 through the first film 7 and increases the amount of light from the light emitting element 1 that is directly emitted to the outside, and also reduce returning light that is reflected at the interface between the sealing member 5 and ambient air. Thus, the amount of light irradiated on the first film 6 can be reduced and thus reduce the amount of light from the fluorescent material 6, which allows adjustment of color of light emitted from the light emitting device 10.

For example, light emitting elements 1 respectively configured to emit red light, green light, and blue light may be mounted in a single light emitting device 10. The plurality of light emitting elements 1 may be arranged irregularly, but a regular arrangement or a periodic arrangement such as in rows and columns or in concentric circles can facilitate obtaining of preferable distribution of light. The plurality of light emitting elements 1 can be electrically connected in series or in parallel, via the conductive members of the mounting base member or via wires.

Sealing Member

A sealing resin containing the fluorescent material 6 is filled in the recess 2a of the package 2 and the sealing member 5 is formed. The sealing member 5 coves the light emitting element 1 and the wires, and has an upper-surface portion 5a where the upper surface curves in a recessed shape. The upper-surface portion 5a has a flat portion 5a at a center and a curved outer peripheral portion 5c surrounding the flat portion 5b. The curved outer peripheral portion 5c is formed inclining or curving with a predetermined angle from the flat portion 5b at the center toward the peripheral edge of the sealing member 5.

Also, the upper surface portion 5a of the sealing member 5 is formed in a substantially rectangular shape when viewed from above. The upper surface portion 5a of the sealing member 5 has an area greater than an area of the upper surface 1a of the light emitting element 1, which is preferably ten times (1000%) or greater. The sealing resin is a light-transmissive material that is filled in the package 2 and hardened to obtain the light-transmissive sealing member 5, so that a thermosetting resin is preferably used for the sealing resin. The sealing member 5 particularly that having a glass transition temperature not greater than room temperature is soft at normal temperature and exhibits good adhesion with the first film 7.

Preferable examples of the light-transmissive material 8 include epoxy resins such as triazine derivative epoxy resins, soft silicone resins or hard silicone resins, epoxy-modified silicone resins, modified silicone resins, and silicone containing resins containing one or two or more composites of those shown above. The sealing member 5 may also be formed with other epoxy resin or silicone resin, or urethane resin or fluororesin. The sealing member 5 contains a fluorescent material 6.

The fluorescent material 6 absorbs at least a portion of primary light emitted from the light emitting element and emits secondary light having different wavelength than that of the primary light. For the fluorescent material 6, for example, a nitride-based fluorescent material or oxynitride-based fluorescent material, mainly activated with a lanthanoid element such as europium or cerium can be used. Specific examples of fluorescent material 6 include α-, or β-sialon-based fluorescent materials and various types of alkaline-earth metal nitride silicate fluorescent materials, which are activated with europium; alkaline-earth metal halogen apatite fluorescent materials, alkaline-earth metal halosilicate fluorescent materials, alkaline-earth metal silicates, alkaline-earth metal haloborate fluorescent materials, alkaline-earth metal aluminate fluorescent materials, alkaline-earth metal silicate fluorescent materials, alkaline-earth metal sulfides, alkaline-earth metal thiogallates, alkaline-earth metal silicon nitrides, and genninates, which are activated mainly with a lanthanoid element such as europium, or with a transition metal element such as manganese; rare-earth aluminates and rare-earth silicates, which are activated mainly with a lanthanoid element such as cerium; and organic compounds and organic complexes which are activated mainly with a lanthanoid element such as europium.

Other than those described above, a fluorescent material 6 having similar properties and/or effects can also be used. The fluorescent material 6 may be locally arranged at the bottom surface 2b side or the light emitting element 1 side of the package 2, or may be dispersed in the sealing member 5.

First Film

The first film 7 is disposed on the upper surface 5a portion of the sealing member 5 so that a portion of the outer edge of the first film 7 is spaced apart from at least a portion of the outer peripheral edge of the sealing member 5. The first film 7 is configured to allow passing of a portion of the light from the light emitting element 1, and reflect another portion of light from the light emitting element 1. The first film 7 is disposed on the flat portion 5b at the center of the upper surface portion 5a of the sealing member 5, so that in the present embodiment, the first film 7 is arranged spaced apart from the outer peripheral edge of the sealing member 5. The first film 7 is formed in a shape of thin film and disposed on the upper surface portion 5a of the sealing member 5 at a location directly above the light emitting element 1 so as to opposite the upper surface (light extracting surface) 1a of the light emitting element 1. The first film 7 has an area smaller than an area of the upper surface portion 5a of the sealing member 5 and similar to or greater than the area of the upper surface 1a of the light emitting element 1. When the area of the upper surface portion 5a of the sealing member 5 is 100% or greater than the area of the upper surface 1a of the light emitting element 1, the first film 7 is disposed with an area in a range of 100% to 800% with respect to the area of the upper surface 1a of the light emitting element 1. With such a range, the upper portion 5a of the sealing member 5 can be prevented from being entirely covered by the first film 7.

The first film 7 contains particles of a light-reflecting material 20 that allows increasing or decreasing of the reflectance according to the density. The particles of the light-reflecting material 20 are nano-particles coated by titanium oxide. The nano-particles can be indicated as particles with particle size in a range of 1 nm to 100 nm. The first film 7 containing nano-particles as the light-reflecting material 20 can be disposed by applying a slurry of particulate material dispersed in a base fluid, using a dispenser-type coating machine. The dispenser-type coating machine can supply a uniform amount of slurry at each dispense. Accordingly, the slurry supplied from the coating machine is spread on the surface of the flat portion 5b of the upper surface portion 5a and forms the first film 7 having a circular shape or an elliptic shape when viewed in the upward direction, with a substantially uniform thickness. A certain amount of the light-reflecting material 20 is contained in each supply of the slurry, and is substantially uniformly distributed in the plane of the first film 7 coated on the upper surface portion 5a. Further, due to the inclination of the curved outer peripheral portion 5c located outward of the flat portion 5b, unnecessary spreading of the first film 7 can be avoided.

The first film 7 thus supplied is dried to obtain the first film 7 of a substantially uniform layer of the nano-particles. At this time, the particle diameter of the dried nano-particles may increase compared to the particle diameter of the nano-particles in the slurry. Thus, the nano-particles with a particle diameter smaller than intended particle diameter of the dried nano-particles in the first film 7 are preferably contained in the slurry. The diameters of the nano-particles can be measured by using a microscopic observation method, a BET method, or the like, and can be determined as an average diameter or a mean diameter. The smaller the nano-particles, the smaller attenuation of propagating light. The nano-particles in the first layer 7 may have diameter of 80 nm or less, preferably in a range of 15 nm to 30 nm. In the present specification, a particle diameter refers to a primary particle diameter.

The filling rate of the nano-particles in the first film 7 that is a volume ratio of the nano-particles with respect to the total volume of the first film 7 is preferably 50% or greater. The first film 7 made of the nano-particles in a range of 20 nm to 30 nm may have a thickness greater than 500 nm, but the closer the content ratio to 100%, the closer the characteristics such as a reflectance to those of the nano-particles. Further, it is known that when the thickness of the first film 7 exceeds 1 μm, crack tend to occur. Thus, the first film 7 is preferably formed with a thickness in a range of 50 nm to 1 μm.

The first film 7 employing titanium oxide has a refractive index of 2.7 and the sealing member 5 employing a silicone resin has a refractive index of 1.53. Thus, the refractive index of the first film 7 is set to a higher value than the refractive index of the sealing member 5. Accordingly, returning light r1 reflected at the first film 7 back to the region directly below the open region 30 can be increased, so that the color-converted light r2 emitted from the open region 30 can be further increased.

In addition to the nano-particles, the first film 7 may be formed with a resin as a binder, a carrier liquid, or air, placed between the nano-particles, and the lower the filling rate of the nano-particles, the greater those components affect the passing rate of light. Also, nano-particles are used as the light-reflecting material 20 and applied on the upper surface portion 5a as a uniform, thin film. Accordingly, without a need of a thick coating of slurry, the first film 7 that serves as a light-reflecting film can be made of particles of titanium oxide, and a desired reflectance can be obtained. Thus, with the use of the dispersing agent, the nano-particles in the slurry may be uniformly attached in a shape of a thin film on the upper surface portion 5a to obtain the first film 7.

The dispersing agent used to disperse the nano-particles that serve as the light-reflecting material 20 is mainly a liquid. Preferable examples of the dispersing agent include ethanol, isopropyl alcohol, toluene, hexane, propanol, petroleum benzine, gasoline, xylene, benzene, carbon tetrachloride, 1,1,1-trichloroethane, 1,2-dichloroethylene, trichloroethylene, tetrachloroethylene, dichloromethane, chloroform, methanol, ethyl ether, acetone, methyl ethyl ketone, methyl isobutyl ketone, cyclohexanone, methyl acetate, ethyl acetate, butyl acetate, methyl cellosolve, ethyl cellosolve, carbon disulfide, acetonitrile, diethylamine, nitrobenzene, tetrahydrofuran, dimethylformamide, N-methyl pyrrolidone, and a fluorine-based liquid. Examples of the fluorine-based liquid include a hydrofluoroether (HFE) and a hydrofluoroolefin (HFO). Also, a mixed liquid can be used for the dispersing agent. In particular, with the use of a liquid that can swell the light-transmissive material such as that used in the first film 7, impregnation of the nano-particles into the light-transmissive in the light-transmissive material can be improved.

In addition, toluene can be used as a diluting liquid to adjust the slurry used for disposing the first film 7, but other appropriate diluting liquid such as isopropyl alcohol or ethanol may alternatively be used. Any appropriate diluting liquid that does not cause aggregation of the nano-particles that obstructs formation of the first film 7 that serves as the light-reflecting film, due to interaction with the sealing member 5 or the like, can be used for the diluting liquid of the slurry.

The dispersing agents and the diluting liquids shown above are examples and a material used as the dispersing agent can also be used as the diluting liquid.

Next, a method of producing a light emitting device 10 will be described.

A metal plate is provided and punching or the like is applied to form a lead frame in a predetermined shape, and using a set of molds, a package 2 defining a recess 2a is molded integrally with the lead frame.

Portions of the lead frame are exposed spaced apart from each other at a bottom surface 2b of the recess 2a of the package 2, and a light emitting element 1 is die-bonded to one of the portions of the lead frame. Further, the light emitting element 1 is electrically connected to the other portion of the lead frame via a wire.

Subsequently, a sealing member 5 containing a fluorescent material 6 is filled in the recess 2a of the package 2 by using, for example, a potting machine. The sealing member 5 is applied in the recess 2a with an amount so that after the sealing member 5 is hardened, the sealing member 5 in the recess 2a has an upper surface curved in a recessed shape. Alternatively, the sealing member 5 of a light-transmissive material 8 is applied in drops to fill the recess 2a of the package 2, then, for example, through a condensation reaction of the light-transmissive material 8, the upper surface portion 5a of the sealing member 5 can be formed in a recesses shape. Or alternatively, the sealing member 5 is applied in drops in the recess 2a of the package 2 to a location slightly below the upper edge of the recess, and the sealing member 5 is allowed to rise up the one or more inner lateral surfaces that define the recess 2a to form the upper surface portion 5a of the sealing member 5 in a recessed shape. In order to form a flat portion 5b at the center and a curved outer peripheral portion 5c surrounding the flat portion 5b in the upper surface portion 5a of the sealing member 5, the filling amount can be adjusted. The flat portion 5b and the curved outer peripheral portion 5c can also be formed by, after filling the sealing member 5, applying a mechanical processing such as pressing or cutting on the sealing member 5.

Subsequently, singulating is carried out by cutting along predetermined border lines around the package 2, thus a light emitting device in which the first film 7 has yet not been formed is obtained. Electric current is applied to the light emitting device to measure the chromaticity.

If the emission of the light emitting device is not in the predetermined range of the chromaticity, the first 7 is disposed on the upper surface portion 5a of the sealing member 5. The first film 7 can be disposed such that, a slurry is applied on the upper surface portion 5a by using a dispenser-type coating machine, and dry the slurry. A desired thickness and/or area of the first film 7 can be obtained by adjusting the amount of the slurry. The sealing member 5 can be naturally dried, then, in order to completely dry the toluene used to swell the sealing resin of the sealing member 5, the light emitting device may be placed in an oven. Alternatively, when needed, applying and drying can be repeated to dispose a plurality of films on one another to obtain the first film 7 of a layered structure. The first film 7 thus formed is spaced apart from the outer peripheral edge of the sealing member 5.

Accordingly, the light emitting devices 10 provided with the first film 7 can be obtained.

In the light emitting device 10, a certain amount of the slurry for obtaining a predetermined area ratio is applied through a dispenser on the upper surface 1a of the light emitting element 1, thus the open region 30 surrounding the outer peripheral edge of the first film 7 can be provided.

Moreover, in the light emitting device 10, the thickness of the first film 7 can be adjusted by adjusting the concentration of the slurry and/or the number of times of application. Accordingly, a desired color correction can be achieved while improving resistance to soldering heat without decreasing the luminous flux.

Further, light from the light emitting element 1 is emitted to the outside from the open region 30 located between the outer peripheral edge 7a of the first film 7 and the outer peripheral edge 5d of the sealing member 5, so that a decrease in amount of emitting light can be reduced. Meanwhile, the wavelength of light reflected at the first film 7 is converted by the fluorescent material 6 in the recess 2a.

The wavelength-converted light passes through the open region 30 that is not covered by the first film 7, and emitted to the outside. In the light emitting device 10, the portion covered by the first film 7 is limited to a portion of center of the upper surface 5a, so that the degree of contribution of light passing through the first film 7 to the emission color and amount of light emitted from the light emitting device 10 can be limited.

Accordingly, in the light emitting device 10, a desired amount of shift in the chromaticity can be securely obtained while securing a desired amount of light by reducing thermal discoloration of the dispersing agent or the like that reduce the amount of light. Thus, the amount of shift in the chromaticity can be adjusted as desired by the location and/or area of the first film 7 and the concentration of the slurry. Thus, variation in the color of light among the light emitting devices 10 can be reduced.

Second Embodiment

A light emitting device according to a second embodiment will be illustrated below with reference to FIG. 5.

Figure 5:
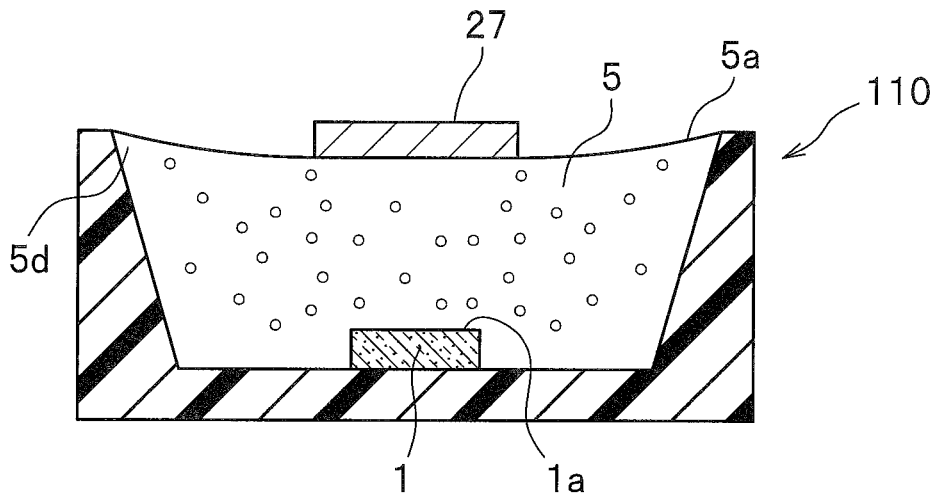
FIG. 5 is a schematic cross-sectional view showing a light emitting device according to a second embodiment.

FIG. 5 is a schematic cross-sectional view showing a light emitting device according to the second embodiment. In the light emitting device 110 according to the second embodiment includes a first film 27 having a thickness greater than the first film 7 of the light emitting device 10 of the first embodiment. Portions the same or similar to those in the first embodiment are assigned the same reference numerals and descriptions thereof may be appropriately omitted.

The first film 27 in the second embodiment is disposed by layering a plurality of films each corresponding to the first film 7 of the first embodiment to have a greater thickness. For example, the first film 27 is disposed with a thickness in a range of about 1.1 times to about 10 times, preferably in a range of about 2 times to about 5 times of the thickness of the first film 7. With this arrangement, the particles of the light-reflecting material in the first layer 27 can be distributed substantially uniformly and occurrence of uneven distribution due to aggregation of the particles or the like can be further reduced. Accordingly, the amount of the light-reflecting material in the first film 27 can be increased, so that the amount of reflected light returning to the sealing member 5 can be increased. When the slurry is applied on the upper surface portion 5a by using a dispenser-type coating machine, the thickness of the first film 27 can be easily adjusted by the number of times of application. Further, the amount of the slurry applied for each layer can be controlled in a predetermined range, so that unintended amount of wet-spreading of the first film 27 can be avoided.

Other configurations and the effects are the same or similar to those described in the first embodiment and detailed description of those will be appropriately omitted.

Third Embodiment

Figure 6:
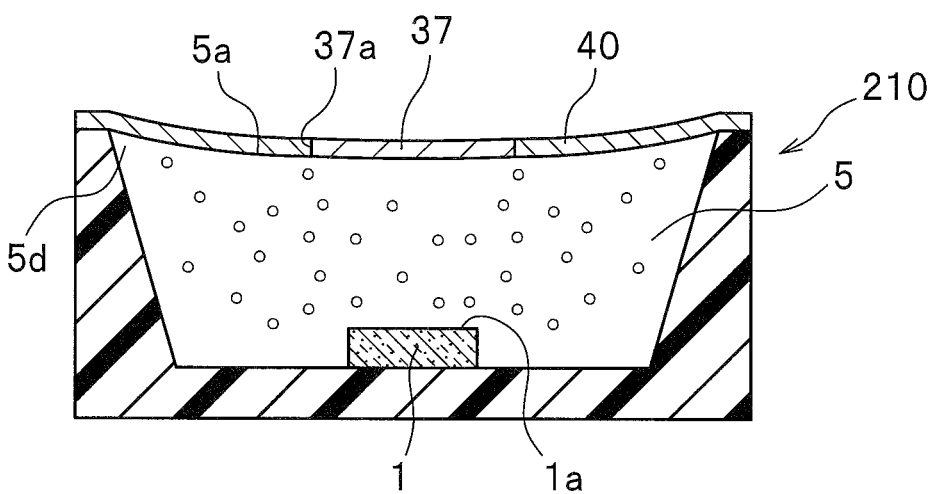
FIG. 6 is a schematic cross-sectional view showing a light emitting device according to a third embodiment.

A light emitting device according to a third embodiment will be illustrated below with reference to FIG. 6. FIG. 6 is a schematic cross-sectional view showing a light emitting device according to the third embodiment.

The light emitting device 210 according to the third embodiment, a light-transmissive film 40 is disposed as a second film around the first film 37, and the state of which is schematically shown in FIG. 6. Portions the same or similar to those in the first embodiment are assigned the same reference numerals and descriptions thereof may be appropriately omitted.

The light-transmissive film 40 is disposed on the upper surface portion 5a of the sealing member 5 at a location between the outer peripheral edge of the first film 37 and outer peripheral edge 37a of the sealing member 5.

The light-transmissive film 40 is made of nano-particles of silicon oxide (SiO$_2$) and has a refractive index (1.46) that is set smaller than the refractive index (1.53) of the light transmissive film 8 that constitutes the sealing member 5. The refractive index (1.46) of the light-transmissive film 40 is also set to a value different from and smaller than the refractive index (2.7) of the first film 37. As described above, by covering the portion of the sealing member 5 at the outer periphery of the first film 37 by the second film, light that is reflected between the sealing member 5 and the ambient air becomes possible to be efficiently extracted to the outside. Accordingly, the extraction efficiency of the light emitting device 210 can be improved.

In the light emitting device 210 having such arrangements as described above, of the upper surface portion 5a of the sealing member 5, the portion between the outer peripheral edge 37a of the first film 37 and outer peripheral edge 5d of the sealing member 5 is covered by the light-transmissive film 40 made of silicon oxide.

The light-transmissive film 40 contains particles of silica, so that dust is hardly attached on the surface of the light emitting device 210 and a reduction of the amount of light can be reduced.

Generally, if a material having a refractive index higher than the refractive index (1.53) of the sealing member 5 is used, the difference in the refractive index with respect to the ambient air increases, which increases the amount of returning light and yellow shift may result.

On the other hand, if a material having a refractive index smaller than the refractive index (1.53) of the sealing member 5 is used, the difference in the refractive index with respect to the ambient air decreases, which reduce the amount of returning light and blue shift may result.

Thus, in addition to or independently of adjusting the thickness of the first film 37, adjusting the area ratio of the light-transmissive film 40 with respect to the area of the first film 37 can further facilitate adjustment of the chromaticity.

Other configurations and the effects are basically the same or similar to those described in the first embodiment and/or the second embodiment, and detailed description of those will be appropriately omitted.

Fourth Embodiment

Figure 7:
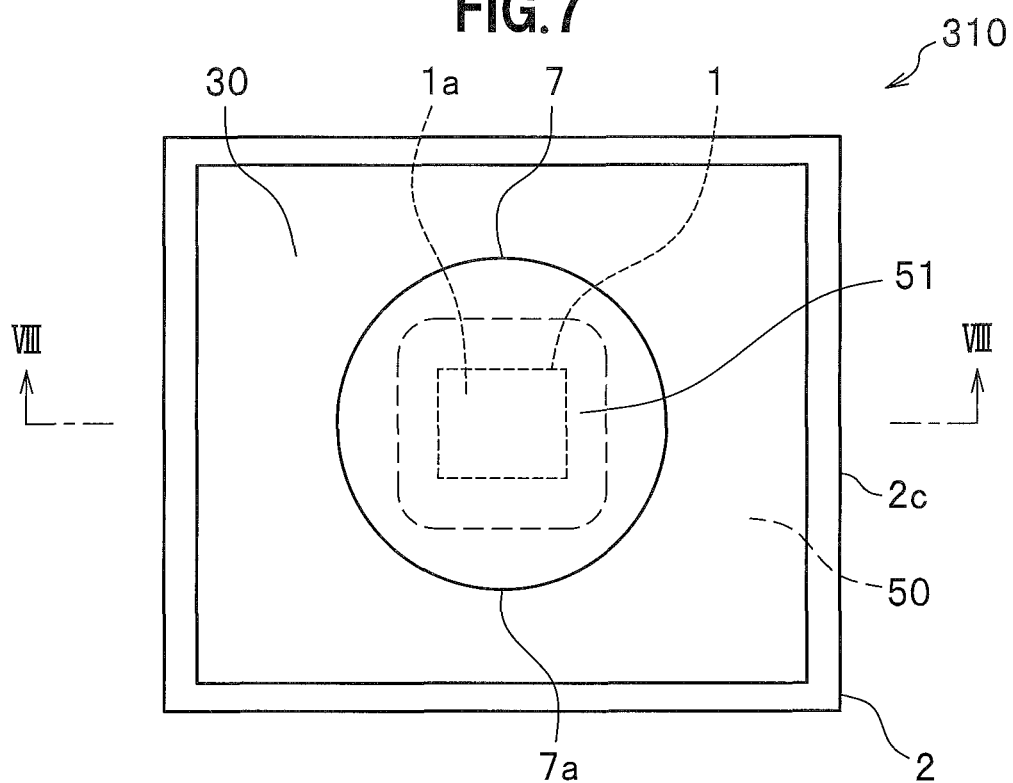
FIG. 7 is a schematic plan view showing a light emitting device according to a fourth embodiment.
Figure 8:
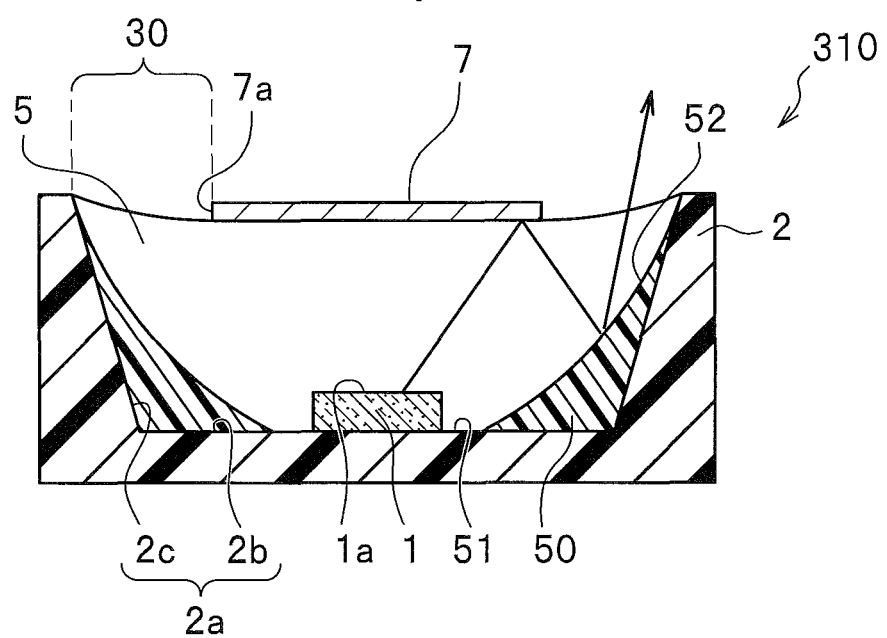
FIG. 8 is a schematic cross-sectional view showing a light emitting device according to the fourth embodiment.

A light emitting device according to a fourth embodiment will be illustrated below with reference to FIG. 7 and FIG. 8. FIG. 7 is a schematic cross-sectional view showing a light emitting device according to the fourth embodiment. FIG. 8 is a schematic cross-sectional view showing the light emitting device according to the first embodiment, taken along line VIII-VIII of FIG. 7. Portions the same or similar to those in the first embodiment are assigned the same reference numerals and descriptions thereof may be appropriately omitted.

In the light emitting device 310, at least a portion of the bottom surface 2b and/or at least a portion of the inner lateral surfaces 2c of the recess 2a of the package 2 is covered by a covering member 50. In the present specification, a "covering member 50" refers to a resin member containing a white light-reflecting material. Examples of the light-reflecting material include oxides of Ti, Zr, Nb, Al, and Si, as well as AlN, MgF, and BN, of those, titanium oxide (TiO$_2$) is preferable.

In other words, the covering member 50 is disposed integrally in the recess 2a so that the covering member 50 continuously covers a portion of the bottom of the recess 2a and corresponding portions of the inner lateral surfaces 2c, with forming a continuous upper surface formed in a recessed shape. The upper surface of the covering member 50 is formed at a predetermined angle α with respect to the bottom surface of the recess 2b and is configured to serve as a light-reflecting surface 52. The predetermined angle of the light-reflecting surface 52 can be in a range of about 1 degree to about 70 degrees, preferably in a range of about 3 degrees to about 60 degrees. Further, the light-reflecting surface 52 is formed in a recessed shape.

When the light-reflecting surface 52 is formed in a recessed shape, the angle α is indicated as an angle between a tangental line to the upper surface of the light-reflecting surface 52 and the bottom surface 2b of the recess 2a.

The bottom surface 2b of the recess is covered by the covering member 50 except for an approximately quadrilateral region surrounding the light emitting element 1 disposed approximately at the center of the bottom surface 2b, so that an exposed region 51 is provided on the bottom surface 2b. The first film 7 is disposed in a circular shape directly above the exposed region 51 that is not covered by the covering member 50. That is, the region directly above the exposed region 51 at the bottom surface 2b that is not covered by the while resin 50 is covered by the first film 7. The area of the exposed region 51 is greater than the area of the upper surface 1a of the light emitting element 1, so that applying the slurry to cover the region directly above the exposed region 51 can securely cover the region directly above the light emitting element 1 by the circular first film 7.

At this time, by setting the first film 7 to the smallest possible area that can cover the region directly above the light emitting element 1, the outer peripheral edge region that is not covered by the first film 7 can be increased. With this arrangement, the light extraction efficiency from the peripheral region that is not covered by the first film 7 can be improved. Also, disposing the covering member 50 to surround the light emitting element 1 can facilitate concentration of light to a region of the first film 7 directly above the light emitting element 1. Accordingly, thus allowing for adjusting the color of light without widening the area of the first film 7. Also, the area of the first film 7 can be decreased, so that a reduction in the amount of light emitted from the light emitting device 310 due to the first film 7 can be decreased.

When the light emitting element 1 has a substantially square shape or a substantially rectangular shape, the length of the diagonal line of the light emitting element 1 is preferably greater than the diameter of the substantially circular first film 7. With this arrangement, the region directly above the light emitting element 1 can be covered by the first film 7.

Moreover, in the light emitting device 310, a decrease in the area of the flat exposed region 51 on the bottom surface under the first film 7 and that is not covered by the covering member 50 can reduce the number of times of repetitive reflection of light emitted from the light emitting element 1 between the first film 7 and the bottom surface of the recess 2a, so that a reduction in the luminous flux resulting from reflection of the light can be reduced.

Further, the upper surface of the covering member 50 is formed at a predetermined angle α with respect to the bottom surface of the recess 2b and is configured to serve as a light-reflecting surface 52. Accordingly, light emitted from the light emitting device 310 can be emitted from the opening region 30 with a further preferable efficiency. Thus, the amount of light emitted to the outside can be increased with a smaller number of reflections.

As described above, in the light emitting device 310 according to the fourth embodiment, contribution of light passing through the first film 7 to the color and amount of light emitted from the light emitting device 310 can be limited, and discoloration hardly affect the emission color, so that the resistance to soldering heat can be improved. Further, by the light-reflecting surface 52 on the covering member 50, the amount of light emitted from the open region 30 can be further increased.

Accordingly, in the light emitting device 310 according to the fourth embodiment, efficient adjustment of chromaticity can be performed with a small area of the first film 7.

Further, the light emitting device 310 has a package 2 with the recess 2a, where a portion of the bottom surface 2b and the lateral surfaces 2c are covered by the covering member 50, so that the amount of light emitted to the outside can be increased with a smaller number of reflections. Thus, compared to the light emitting device of reference example, discoloration of the first film 7 can be reduced and even with an increase in the slurry concentration for the first film 7, the resistance to soldering heat can be improved.

Other configurations and the effects are basically the same or similar to those described in the first embodiment to the third embodiment, and detailed description of those will be appropriately omitted.

Appropriate variations in the configurations of those described in the first embodiment to the fourth embodiment can also be included. One or more part of the configurations in the first to the fourth embodiments can be applied to other configurations in the first to the fourth embodiments, as illustrated below.

For example, the area of the first film 7 of the light emitting element 1 in the first embodiment is set to about 14% of the area of the upper surface portion 5a of the sealing member 5. The area of the first film 7 can also be set particularly preferably in a range of 10% to 50% to the area of the upper surface portion 5a of the sealing member 5, with which the open region 30 free from the first film 7 can be provided.

The area of the upper surface portion 5a of the sealing member 5 is greater than the upper surface 1a of the light emitting element 1 and that allows for providing the open region 30. The area of the upper surface portion 5a is further preferably 1000% or greater than the area of the upper surface 1a of the light emitting element 1, that allows for the area of the first film 7 to be in a range of 100% to 800% of the upper surface 1a of the light emitting element 1.

Further, in the first, second, and fourth embodiments, the open region 30 is provided surrounding the outer peripheral edge of the first film 7, but a portion of the peripheral edge of the first film 7a may be in contact with the outer peripheral edge of the sealing member 5 so that at least a portion of the peripheral edge of the first film 7a is spaced apart from the outer peripheral edge of the sealing member 5.

The light emitting element 1 may be of a gallium arsenic-based semiconductor or a gallium phosphorus-based semiconductor that can emit light in a range of green to red range. When the light emitting device 10 is configured to emit a white light, in view of mixing color with the wavelength converted light emitted from the fluorescent material 6, the light emitting element 1 preferably has an emission wavelength in a range of 400 nm to 530 nm, more preferably in a range of 420 nm to 490 nm.

The light emitting element 1 may use a growth substrate that allows growth of semiconductor crystals that constitute the semiconductor element structure, or may use a bonding substrate that is bonded to the semiconductor element that is separated from the growth substrate.

Examples of the light-transmissive member of the crystal growth substrate include sapphire, spinel, gallium nitride, aluminum nitride, silicon, silicon carbide, gallium arsenide, gallium phosphide, indium phosphide, zinc sulfide, zinc oxide, zinc selenide, and diamond. The substrate can be optional.

When the light emitting element 1 has positive and negative electrodes on a same side, the light emitting element 1 may be mounted in face-up manner with the positive and negative electrodes are electrically connected to corresponding electrically conductive members via wires respectively, or mounted in face-down manner with the positive and negative electrodes are electrically connected to corresponding electrically conductive members of the mounting substrate via electrically conductive adhesive respectively.

A configuration with a metal layer such as silver or aluminum or a dielectric light-reflecting film disposed on the mounting surface side of the light emitting element 1 may also be employed.

Further, the sealing member 5 is disposed to be in contact with the light emitting element 1. The sealing member 5 is disposed to cover directly above the light emitting element 1, where the sealing member 5 may be spaced away from the light emitting element 1.

EXAMPLES

Figure 9:
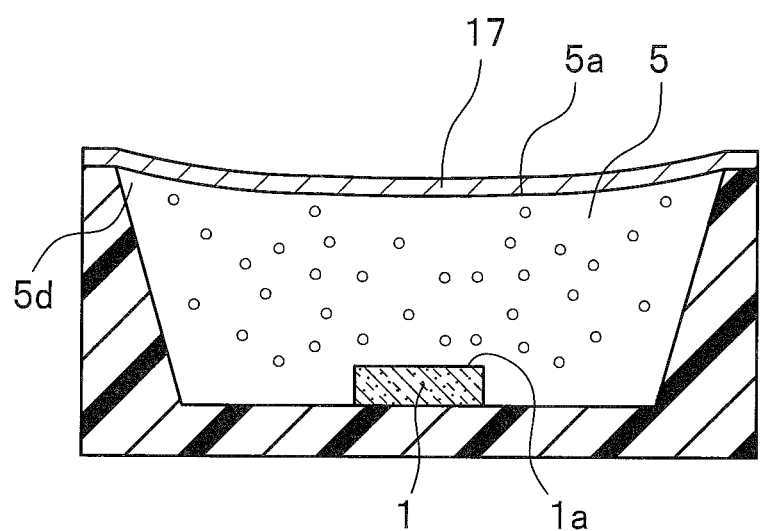
FIG. 9 is a schematic cross-sectional view of a light emitting device according to a reference example.

Examples of the light emitting device according to the embodiments will be illustrated below with reference to FIG. 1 to FIG. 4. FIG. 9 is a schematic cross-sectional view of the light emitting device of Reference Examples 2 to 4.

Example 1, Reference Examples 1-4

The light emitting device according to Example 1 has a configuration similar to that illustrated in the first embodiment. Descriptions of those having similar configurations may be appropriately omitted.

The light emitting device according to Embodiment 1 includes a light emitting element 1 having an approximately square shape when viewed in the upward direction, a package 2 having the light emitting element 1 mounted thereon, a sealing member 5 covering the light emitting element 1 and having an upper surface formed in a recessed shape, and a first film 7 disposed on a portion of the upper surface of the sealing member 5 and is configured to allow a portion of light from the light emitting element 1 to pass through and reflect a portion of light from the light emitting element 1. For the package 2, a package used for a product No. NFSW757D manufactured by Nichia Corporation is used. When viewed in the upward direction, the first film 7 is disposed at an approximately center of the recess 2a of the package 2. When viewed in the upward direction, the first film 7 has an approximately circular shape and covers directly above the light emitting element 1. The diameter of the first film 7 is about 1.5 times of the length of the diagonal line of the light emitting element 1. The sealing member 5 contains a fluorescent material 6 to convert the wavelength of light from the light emitting element 1 and a light-transmissive material 8 that contains the fluorescent material 6. The fluorescent material 6 is a YAG fluorescent material. Outer peripheral edge of the first film 7 and outer peripheral edge of the sealing member 5 are spaced apart from each other.

The light emitting device of Example 1 was formed such that the first film 7 is disposed on the upper surface portion 5a of the sealing member 5 by applying a slurry on the upper surface portion 5a using a dispenser-type coating machine. The concentration of titanium oxide in the undiluted slurry is assumed to be 15 wt % (parts by weight), and in Example 1, the undiluted slurry is diluted to 0.3 wt % by a diluting liquid. For titanium oxide, nano-particles of a size in a range of about 15 to 20 nm are used. For the diluting liquid, toluene (85%) added with a dispersion agent of ethanol (15%) is used. The slurry is discharged from a circular opening of the coating machine so that an amount of 0.03 mg/shot is applied (sprayed) at the flat portion 5b at the center of the upper surface portion 5a. Then the diluting liquid is evaporated in natural drying to obtain the first film 7.

Meanwhile, the light emitting device of Reference Example 1 is not provided with the first film. The light emitting device of Example 1 and the light emitting device of Reference Example 1 have a same configuration except the presence or absence of the first film. Each of the light emitting devices of Reference Examples 2 to 4 has the first film 17 provided on the entire surface of the sealing member 5. The light emitting device of Example 1 and the light emitting device of Reference Examples 2 to 4 have a same configuration except the configuration of the first film. Undiluted slurry is diluted to 0.05 wt % in Reference Example 2 to 0.1 wt % in Reference Example 3, and to 0.2 wt % in Reference Example 4 to obtain the respective first film 17.

Shift Amount of Chromaticity and Change in Luminous Flux

Figure 10:
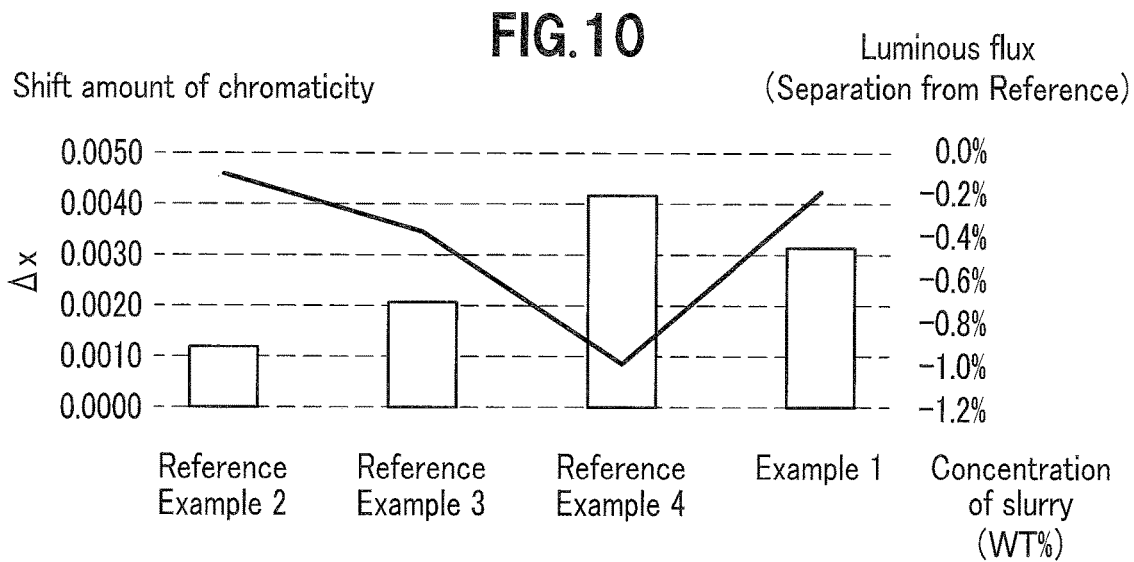
FIG. 10 is a graph showing properties of a light emitting device according to an example.

FIG. 10 is a diagram showing properties of light emitting devices according to Example 1 and Reference Examples 1 to 4. The light emitting device of Reference Example 1 absence of the first film is used as a standard and the separation from the standard values are compared in FIG. 10. For the separation from the standard values, the decrease ratio of the luminous flux (%) and the shift amount of chromaticity coordinates (as $\Delta x$) are measured. In FIG. 10, the values of $\Delta x$ is a value of shift in chromaticity coordinates calculated according to the CIE 1931 XYZ display color system established by the International Electrotechnical Commission (CIE).

An integrating sphere is used for measuring the luminous flux (1 m) and the chromaticity coordinates (x, y) of the light emitting devices of Example 1 and Reference Examples 1 to 4, respectively. The decrease ratio of the luminous flux (% as absolute value ratio) and the shift amount of chromaticity coordinates ($\Delta x$, $\Delta y$) of the light emitting devices were respectively calculated from the obtained separation from the values of the light emitting device of Reference Example 1. The values of the change in the luminous flux is shown in a zigzag line and the absolute value ratios (in %) are shown at the right side of the graph. The shift amounts of chromaticity coordinates (as $\Delta x$) are shown in the left side of the graph.

The results show that from Reference Example 2 to Reference Example 4, the higher the slurry concentration, the lower the luminous flux. This is due to that an increase in the titanium oxide in the first film 17 increase the amount of light reflected at the first film 17 covering the entire upper surface of the sealing member 5 and returning in the recess of the package 2, resulting in attenuation of light.

Meanwhile, from Reference Example 2 to Reference Example 4, the higher the slurry concentration, the greater the shift amount of chromaticity coordinates (as $\Delta x$). This is due to that an increase in the titanium oxide in the first film 17 increase the amount of light reflected at the first film 17 covering the entire upper surface of the sealing member 5 and returning in the recess of the package 2, resulting in attenuation of light. This is due to that an increase in the titanium oxide in the first film 17 increase the amount of light reflected at the first film 17 covering the entire upper surface of the sealing member 5 and returning in the recess of the package 2, which irradiates the fluorescent material 6 in the recess of the package 2 and increase the amount of light emitted from the fluorescent material 6.

Accordingly, from the results shown above, it is determined that if the slurry of high concentration is applied to greatly shift the chromaticity coordinates in order to provide a desired color of light, the luminous flux decreases.

In contrast, in the light emitting device of Example 1, the luminous flux similar to that of the Reference Example 1 can be maintained while increasing the shift amount of chromaticity coordinates. This is due to that in the light emitting device of Example 1, the first film 7 is provided at a location directly above the light emitting element 1 having a large amount of light, and the open region 30 absent of the first film 7 is provided at the outer peripheral edge of the first film 7 and outer peripheral edge of the first film 7. Accordingly, a portion of light emitted from the light emitting element 1 is reflected at the first film 7 but a portion of light emitted from the light emitting element 1 is released to the outside from the open region 30, so that the light emitting device of Example 1 exhibits a smaller decrease in the luminous flux. Also, the first film allows most of the light from the light emitting element 1 to pass through, so that reduction in the amount of light emitted from the light emitting element 1 can be decreased.

Also, a portion of light emitted from the light emitting element 1 is reflected at the first film 7 located directly above the light emitting element 1 and returned to the recess of the package 2, which irradiates the fluorescent material 6 in the recess of the package 2 and increase the amount of light emitted from the fluorescent material 6. Thus, the shift amount of chromaticity coordinates can be increased.

Example 2, Reference Examples 5, 6

Each of the light emitting devices according to Example 2 has the first film covering a portion of the upper surface of the sealing member 5. The light emitting device according to Reference Example 5 is not provided with the first film. The light emitting device according to Reference Example 6 has the first film covering the entire upper surface of the sealing member 5.

The light emitting device according to Example 2 has a configuration similar to that of the light emitting device according to Example 1.

The light emitting device according to Reference Example 5 has a configuration similar to that of the light emitting device according to Reference Example 1. The light emitting device according to Reference Example 6 has a configuration similar to the light emitting device according to Example 1, except for the size of the first film. That is, the first film of the light emitting device according to Reference Example 6 and the first film of the light emitting device according to Example 1 are disposed by using the slurry of similar concentration.

Resistance to soldering heat was examined in the light emitting devices according to Example 2 and Reference Examples 5 and 6.

High resistance to soldering heat is indicated to the light emitting device that exhibits low discoloration and small change in the luminous flux when exposed to a high temperature. Meanwhile, low resistance to soldering heat is indicated to the light emitting device that exhibits change in the luminous flux caused by discoloration.

Mounting of the light emitting device on a mounting substrate is generally made by using a solder, so that the light emitting device that experience little change in the color and little change in the amount of light by the soldering heat is needed. In order to achieve the above, there has been a room for improving the resistance to soldering heat to reduce discoloration that affect the color and amount of light of the light emitting device.

The results of resistance to soldering heat of the light emitting devices according to Example 2 and Reference Examples 5 and 6 are shown in Table 1.

TABLE 1

|  | Number of times of heating | | | |
| --- | --- | --- | --- | --- |
|  | 0 | 1 | 2 | 3 |
|  | Planar size of first film (%) | | | |
| Reference Example 5 | 100.0 | 98.9 | 98.2 | 97.7 |
| Reference Example 6 | 100.0 | 98.2 | 97.3 | 96.6 |
| Difference value between reference Example 5 and Reference Example 6 | 0.0 | −0.7 | −0.9 | −1.1 |
| Example 2 | 100.0 | 98.7 | 98.0 | 97.5 |
| Difference value between Reference Example 5 and Example 2 | 0.0 | −0.2 | −0.2 | −0.2 |

For the each of the light emitting devices of Example 2, and Reference Examples 5 and 6, a heating process at about 260° C. using a reflow furnace is repeated for one to three times to produce a state equivalent to soldering process. At each time when a heating process completes, the luminous flux of each of the light emitting devices is measured, and the results are shown in Table 1.

The resistance to soldering heat is determined by measuring a decrease in the luminous flux cause by discoloration of the first film. For that, the light emitting device of Reference Examples 5 is measured and the measured values are used as standard values to compare the measured values of the light emitting devices of Example 2 and Reference Examples 6.

For each light emitting device, the luminous flux in the state where heat is not applied, that is, the number of heating process is zero, is assumed 100.0%, and a difference in the luminous flux measured at the completion of each heating process is calculated and compared. It is determined that the smaller the absolute value of the difference, the higher resistance to soldering heat.

In the comparison of the results of the measurement, for example, the resistance to soldering heat after three times of heating processes, the luminous flux maintenance ratio of the light emitting device of Reference Example 6 is 96.6%, while the luminous flux maintenance ratio of the light emitting device of Reference Example 5 is 97.7%. The difference is −1.1 points, indicating a greater reduction in the luminous flux maintenance ratio.

In contrast, the luminous flux maintenance ratio of the light emitting device of Example 2 is 97.5%, while the luminous flux maintenance ratio of the light emitting device of Reference Example 5 is 97.7%. The difference is −0.2 points, the absolute value of the difference is smaller than that of the Reference Example 6, indicating good resistance to soldering heat.

Further, while the difference amount of the light emitting device of Reference Example 6 tends to increase as the number of times of heating process increases, the difference amount of the light emitting device of Example 2 retains −0.2 points despite an increase in the number of times of heating process and exhibits little change.

From the results shown above, influence of discoloration is smaller in the light emitting device of Example 2 compared to that of the light emitting device of Reference Example 6, indicating an improvement in the resistance to soldering heat in the light emitting device of Example 2.

Examples 3 to 8, Reference Examples 7 to 9

Each of the light emitting devices according to Examples 3-8 has the first film covering a portion of the upper surface of the sealing member 5. The light emitting device according to Reference Example 7 is not provided with the first film. The light emitting devices according to Reference Examples 8 and 9 respectively have the first film covering the entire upper surface of the sealing member 5.

The light emitting device according to Examples 3 to 8 has a configuration similar to the light emitting device according to Example 1, except for the size of the first film and the concentration of the slurry.

In Examples 3 to 8, as a concentration of the slurry, 0.3 wt % of titanium oxide is employed. For titanium oxide, nano-particles of a size in a range of about 15 to 20 nm is used. Toluene is used as the base fluid.

The light emitting devices of Examples 3 to 8, and Reference Examples 7 to 9 are provided with varying a ratio of the area of the first film 7 with respect to the area of the upper surface portion 5a of the sealing member 5 (hereinafter may be referred to as an "area ratio") to determine a range of the area ratio that allows shifting of the chromaticity coordinates without reducing the amount of light. The results are shown in Table 2 and FIGS. 11 and 12.

For example, in Example 3, the first film 7 is provided on the upper surface of the sealing member 5 to cover the portion directly above the upper surface 1a of the light emitting element 1, and the open region 30 is also provided. The area ratio of the first film 7 with respect to the area of the area of the upper surface portion 5a of the sealing member 5 is 7%. Also, the area ratio of the first film 7 with respect to the area of the upper surface 1a of the light emitting element 1 is 110%.

In Examples 4 to 8, the area ratios of the first film 7 are increased with respect to the area ratio of the first film 7 in Example 2, while providing the opening region 30 surrounding the first film 7.

Meanwhile, Reference Example 7 is absent of the first film. That is, the light emitting device of Reference Example 7 is not provided with the first film 1, so that the area ratio of the first film 7 with respect to the upper surface portion 5a of the sealing member 5 is 0%, and also, the area ratio of the first film 7 with respect to the upper surface 1a of the light emitting element 1 is 0%.

In Reference Examples 8 and 9, the entire of the upper surface portion 5a is covered by the first film 7 (area ratio of 100%).
In this case, when the area ratio of the first film 7 with respect to the area of the upper surface portion 5a is 100%, it can also imply that the area ratio of the first film 7 with respect to the area of the upper surface 1a of the light emitting element 1 is about 1,600%.

In Table 2, the ratios of the areas of the first film 7 with respect to the area of the upper surface 1a of the light emitting element 1 are shown in the respective parentheses. Although the area ratios of the first films 7 in Examples 4 and 5 and the area ratios of the first films in Reference Examples 8 and 9 are respectively the same, different shift amounts and change in the luminous fluxes are exhibited, due to individual differences.

For the sealing member 5, a soft-silicone resin having a refractive index of 1.52 at a wavelength of 589 nm is used as a base material and the fluorescent material 6 of YAG:Ce is contained in the base material. The fluorescent material 6 was dispersed in the base material of the sealing member 5 so as to be located above and around the light emitting element 1.

In the first film 7, nano-particles of titanium oxide having a refractive index of 2.62 at a wavelength of 589 nm and a median particle diameter of 36 nm are dispersedly arranged to form a substantially uniform film with a thickness in a range of 50 nm to 1 μm.

With the conditions described above, different amounts of the slurry are applied on the upper surface portions 5a respectively, then, at a temperature of about 260° C., the light emitting devices were introduced in a reflow furnace for three times. Thus, the light emitting devices of Examples 3 to 8, and Reference Examples 8 and 9 having the first films 7 of different area ratios were obtained.

Shift Amount of Chromaticity Coordinates, Resistance to Soldering Heat

Figure 11:
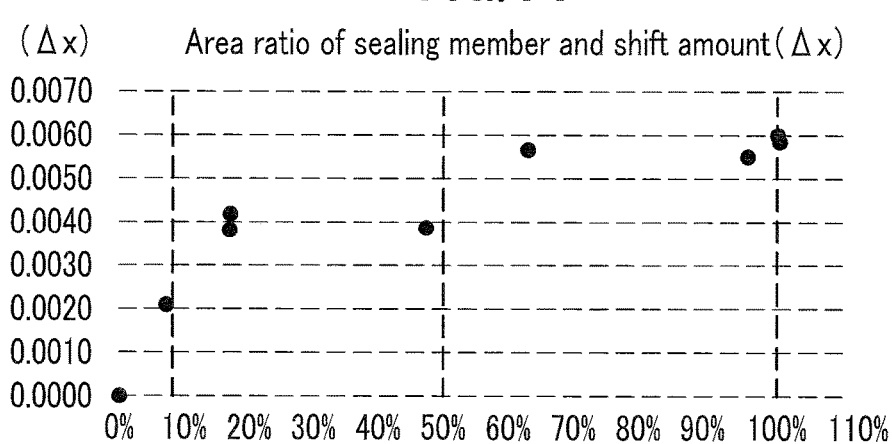
FIG. 11 is a graph showing properties of a light emitting device according to an example.
Figure 12:
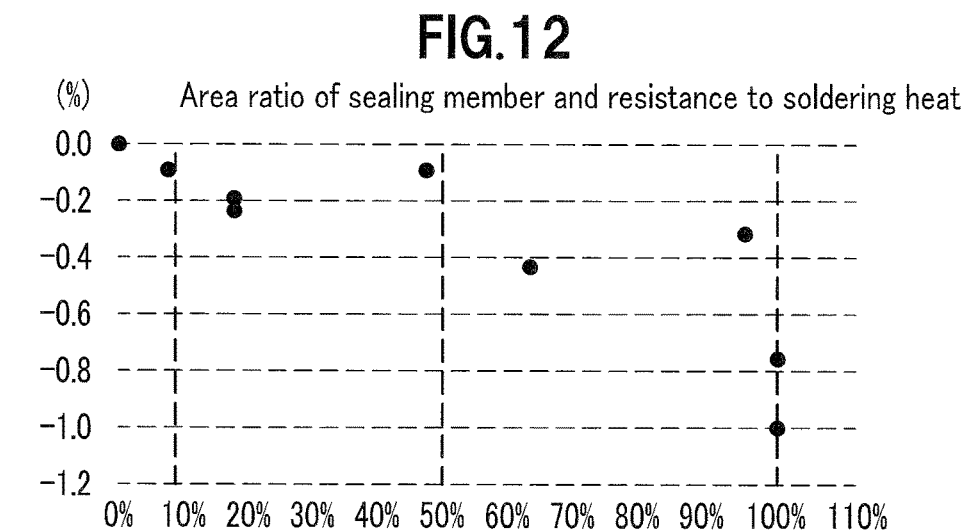
FIG. 12 is a graph showing properties of a light emitting device according to an example.

The shift amount of chromaticity coordinates and resistance to soldering heat of the light emitting devices of Examples 3 to 8 and Reference Examples 7 to 9 will be described below. FIG. 11 is a graph showing properties of light emitting devices according to certain examples. In FIG. 11, the horizontal axis represents the area ratio of the first film 7 and the vertical axis represents shift amounts of chromaticity coordinates (as Δx) obtained from the measured chromaticity coordinates, and the shift amounts of chromaticity coordinated (as Δx) of the light emitting devices of Examples 3 to 8 and Reference Examples 7 to 9 are marked. FIG. 12 is a graph showing properties of light emitting devices according to certain examples. In FIG. 12, the horizontal axis represents the area ratio (%) of the first film 7 and the vertical axis represents the reduction ratio (%) of the luminous flux that indicates resistance to soldering heat, and the reduction ratio of the luminous flux of the light emitting devices of Examples 3 to 8 and Reference Examples 7 to 9 are marked.

Table 2 shows the results of measurements of the shift amount of chromaticity coordinates and the reduction ratio of the luminous flux of the light emitting devices of Examples 3 to 8 and Reference Examples 7 to 9.

TABLE 2

| | Area ratio of first film (Area ratio) First film/Upper surface of sealing resin (First film/Upper surface of light emitting element | Shift Amount | | Luminous flux (Absolute value) | After three times of reflow Degradation ratio of luminous flux |
|---|---|---|---|---|---|
| | | Δx | Δy | | |
| Example 3 | 7% (110%) | 0.0021 | 0.0027 | 99.8% | −0.1% |
| Example 4 | 17% (264%) | 0.0038 | 0.0046 | 99.8% | −0.2% |
| Example 5 | 17% (264%) | 0.0042 | 0.0051 | 99.9% | −0.2% |
| Example 6 | 47% (731%) | 0.0039 | 0.0045 | 99.9% | −0.1% |
| Example 7 | 62% (974%) | 0.0057 | 0.0058 | 99.5% | −0.4% |
| Example 8 | 95% (1493%) | 0.0056 | 0.0056 | 99.6% | −0.3% |
| Reference Example 7 | 0% (0%) | 0.0000 | 0.0000 | 100.0% | 0.0% |
| Reference Example 8 | 100% (1570%) | 0.0060 | 0.0054 | 99.0% | −1.0% |
| Reference Example 9 | 100% (1570%) | 0.0059 | 0.0056 | 99.1% | −0.8% |

The results shown in Table 2 indicates a tendency of the greater the area of the first film 7, the greater the shift amounts Δx of the light emitting device according to Examples 3 to 8 and Reference Examples 8 and 9. In the light emitting devices of Examples 3 to 6, when the area ratio of the first film 7 with respect to the area of the upper surface 5a of the sealing member 5 is in a range of about 7% to about 50%, the shift amounts (Δx) of Δx≥0.0020 are achieved. Further, in the light emitting devices of Examples 7 and 8, when the area ration of the first film 7 exceeds 50%, the shift amounts Δx that have been in a tendency of increasing seem to hit a plateau around Δx=0.0060.

Accordingly, the light emitting devices of Examples 6 to 6 having the area ratio of the first film 7 with respect to the area of the upper surface 5a of the sealing member 5 in a range of about 10% to about 50% seem most suitable to adjust the shift amounts Δx.

Also, the luminous flux according to Reference Example 7, Examples 3 to 8 and Reference Examples 8 and 9 exhibit tendency of decreasing the luminous flux corresponding to an increase in the area ratio of the first film 7 with respect to the area of the upper surface 5a of the sealing member 5.

In the light emitting devices of Examples 3 to 6, when the area ratio of the first film 7 is in a range of about 7% to about 50%, the luminous flux is maintained at a small reduction ratio (%), indicating good resistance to soldering heat. However, as in Examples 7, 8, when the area ratio of the first film 7 exceeds 50%, the reduction ratio (%) of the luminous flux gradually increases, and as in Reference Examples 8 and 9, when the area ratio of the first film 7 reaches 100%, the reduction ratio (%) of the luminous flux shows 0.8% and 1.0%.

From the results of measurement of Examples 3 to 8 and Reference Examples 7 to 9, the first film 7 is disposed above the upper surface 1a of the light emitting element 1 so that when the area ratio of the first film 7 with respect to the area of the upper surface 5a of the sealing member 5 is in a range of 10% to 50%, or the area ratio of the first film 7 with respect to the area of the upper surface 1a of the light emitting element 1 is preferably in a range of about 100% to about 800%, the shift of the chromaticity coordinates without decreasing the amount of light is assumed to be obtained.

That is, when the area of the upper surface portion 5a is about 1,600% of the area of the upper surface 1a of the light emitting element 1, the upper surface portion 5a is preferably covered by the first film 7 so that the area ratio of the first film 7 with respect to the upper surface portion 5a is in a range of 10% to 50%, and area ratio of the first film 7 with respect to the upper surface 1a of the light emitting element 1 is in a range of 100% to 800%. Also, it is found that in the Examples 4, 5 and Reference Examples 8, 9, the presence of individual difference in the location of the first film 7 exert small effect on the measurement results.

The light emitting devices according to certain embodiments of the present disclosure can be respectively used with a light sources of various light emitting elements as well as a semiconductor light emitting element such as a light emitting diode, and can be employed for various light sources. For example, a backlight light source for liquid crystal display device, various lighting apparatus, a large-sized display device, various display devices for advertising, destination guiding, or the like, further for a digital video camera, image reading apparatus for a facsimile machine, a copying machine, a scanner, or the like, a projector, and so on.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

Obviously, numerous modifications and variations of the present invention are possible in light of the above teachings. It is therefore to be understood that within the scope of the appended claims, the invention may be practiced otherwise than as specifically described herein.

What is claimed is:
1. A light emitting device comprising:
a light emitting element having a light emitting surface from which a light is emitted;
a sealing member provided on the light emitting surface of the light emitting element to cover the light emitting surface and having a light output surface via which the light is output from the sealing member, the light output surface having a flat portion and a curved outer peripheral portion surrounding the flat portion, the sealing member comprising a light-transmissive material containing a fluorescent material to convert a wavelength of the light emitted from the light emitting element; and
a first film disposed on a part of the light output surface of the sealing member to partially reflect the light emitted from the light emitting element,
wherein the first film has a thickness in a range of 50 nm to 1 μm, and
wherein the first film is only disposed on the flat portion of the light output surface.

2. The light emitting device according to claim 1, wherein the light output surface has an output surface outer peripheral edge and the first film has a film outer peripheral edge, the film outer peripheral edge is apart from the output surface outer peripheral edge.

3. The light emitting device according to claim 2, wherein an entirety of the film outer peripheral edge is apart from the output surface outer peripheral edge.

4. The light emitting device according to claim 1, wherein the light emitted from the light emitting element partially passes through the first film.

5. The light emitting device according to claim 1, wherein the first film covers over the light emitting element in a height direction of the light emitting device.

6. The light emitting device according to claim 1 further comprising:
a package comprising a recess having an opening defined by an upper edge of the package and a bottom surface opposite to the opening in a height direction of the light emitting device,
wherein the light emitting element is mounted on the bottom surface,
wherein the sealing member is disposed in the recess, and
wherein the upper edge and the first film are at least partially spaced apart from each other.

7. The light emitting device according to claim 1, wherein the first film contains nano-particles having a length in a range of 1 nm to 100 nm.

8. The light emitting device according to claim 1, wherein the first film has a refractive index greater than a refractive index of the sealing member.

9. The light emitting device according to claim 1, wherein the first film contains nano-particles coated by titanium oxide.

10. The light emitting device according to claim 1, wherein a plurality of films are layered in the first film.

11. The light emitting device according to claim 1, wherein the first film has a first film lower surface opposite to the light emitting surface, the first film lower surface having a first planar dimension equal to or larger than a second planar dimension of the light emitting surface and also smaller than a planar dimension of the light output surface.

12. The light emitting device according to claim 1, wherein a planar dimension of the light output surface is at least 1000% with respect to a planar dimension of a light emitting element upper surface of the light emitting element, while a planar dimension of a first film lower surface is in a range of 100% to 800% with respect to the planar dimension of the light output surface.

13. The light emitting device according to claim 1, wherein the planar dimension of a first film lower surface of the first film which is opposite to the light emitting surface is in a range of 10% to 50% with respect to the planar dimension of the light output surface.

14. The light emitting device according to claim 2, wherein a second film having a refractive index different from a refractive index of the first film is disposed on the light output surface and between the film outer peripheral edge and the output surface outer peripheral edge.

15. The light emitting device according to claim 14, wherein the second film has a refractive index smaller than a refractive index of the light-transmissive material.

16. The light emitting device according to claim 14, wherein the second film contains particles of silica.

17. The light emitting device according to claim 1 further comprising:
    a package comprising a recess having an opening, a bottom surface opposite to the opening in a height direction of the light emitting device, and at least one inner lateral surface extending from the bottom surface to the opening,
    wherein either the bottom surface or the at least one inner lateral surface is at least partially covered by a covering member.

18. The light emitting device according to claim 17, wherein the covering member covers at least a portion of the bottom surface, and
    wherein the first film covers over a portion of the bottom surface which is not covered by the covering member.

19. The light emitting device according to claim 17, wherein the covering member has at least one light-reflecting surface inclined from the bottom surface at a predetermined angle.

20. The light emitting device according to claim 19, wherein the predetermined angle of the light-reflecting surface is in a range of 1 degree to 70 degrees.

21. The light emitting device according to claim 1, wherein when viewed in a height direction of the light emitting device, the light emitting surface of the light emitting element has either one of a square shape, a rectangular shape, a pentagonal shape, a hexagonal shape, a heptagonal shape, or an octagonal shape, and the first film has a film outer peripheral edge having a circular shape or an elliptic shape.

22. A light emitting device comprising:
    a package comprising a recess having an opening defined by an upper edge of the package and a bottom surface opposite to the opening in a height direction of the light emitting device;
    a light emitting element disposed on the bottom surface of the package and having a light emitting surface from which a light is emitted;
    a sealing member provided on the light emitting surface of the light emitting element in the recess to cover the light emitting surface and having a light output surface via which the light is output from the sealing member, the light output surface comprising a flat portion and a curved outer peripheral portion surrounding the flat portion, the curved outer peripheral portion connecting the flat portion and the upper edge of the package, the sealing member comprising a light-transmissive material containing a fluorescent material to convert a wavelength of the light emitted from the light emitting element; and
    a first film disposed on the flat portion to partially reflect the light emitted from the light emitting element,
    wherein the first film is only disposed on the flat portion of the light output surface.

* * * * *